US006583642B2

(12) United States Patent
Huang et al.

(10) Patent No.: US 6,583,642 B2
(45) Date of Patent: Jun. 24, 2003

(54) APPARATUS AND METHOD FOR AUTOMATIC DETERMINATION OF OPERATING FREQUENCY WITH BUILT-IN SELF-TEST

(75) Inventors: Hung-Ju Huang, Taipei (TW); Chun-An Tu, Tainan Hsien (TW); Hung-Ta Pai, Taichung Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 118 days.

(21) Appl. No.: 09/930,974

(22) Filed: Aug. 17, 2001

(65) Prior Publication Data

US 2003/0034791 A1 Feb. 20, 2003

(51) Int. Cl.[7] .......... G01R 31/26

(52) U.S. Cl. .......... 324/765; 324/763; 365/201; 714/733

(58) Field of Search .......... 324/73.1, 763, 324/765, 158.1; 365/201, 189.07; 714/718–719, 724, 733–734, 738

(56) References Cited

U.S. PATENT DOCUMENTS 5,568,437 A * 10/1996 Jamal .......... 365/201
5,764,655 A * 6/1998 Kirihata et al. .......... 714/733
5,892,368 A * 4/1999 Nakata et al. .......... 324/763

* cited by examiner

*Primary Examiner*—Kamand Cuneo
*Assistant Examiner*—Minh N. Tang
(74) *Attorney, Agent, or Firm*—Birch, Stewart, Kolasch & Birch, LLP

(57) ABSTRACT

An apparatus automatically determines an operating frequency of an integrated circuit (IC) chip that has a built-in self-test (BIST) unit to test the chip. The apparatus includes a clock generator and a frequency determination unit. The clock generator provides a test clock to the IC chip. The frequency determination unit sets the clock generator to generate the test clock and determines the operating frequency in accordance with a test result produced from the BIST unit. The frequency determination unit also enables the BIST unit to test the IC chip. Specifically, the frequency determination unit tunes a frequency value based on the test result, and sets the clock generator to generate the test clock corresponding to the tuned frequency value. Accordingly, the apparatus determines the highest frequency passing the built-in self-test, and sets the highest frequency for the IC chip as its operating frequency.

20 Claims, 4 Drawing Sheets

APPARATUS AND METHOD FOR AUTOMATIC DETERMINATION OF OPERATING FREQUENCY WITH BUILT-IN SELF-TEST

FIELD OF THE INVENTION

The present invention relates generally to an integrated circuit and, more specifically, to an integrated circuit chip with built-in self-test (BIST) capability.

BACKGROUND OF THE INVENTION

In recent years, built-in self-test (BIST) circuitry has been incorporated within integrated circuit (IC) chips to facilitate testing without the need for complex external test equipment. The advantages of BIST are that no special test patterns or test equipment are required and the integrated circuits can be tested independent of environment.

FIG. 1 illustrates a conventional IC chip 10 including a BIST unit 12 and circuitry 14, the latter of which can be memory elements and/or logic circuits. The BIST unit 12 applies a test condition 16 to the circuitry 14 and, at the conclusion of the self-test, checks the return value 18 emitted from the circuitry 14. If the return value 18 is different from that expected, there will be at least one defect in the circuitry 14. Provision of the BIST capability within an IC chip enables defects or other problems that might arise in the operation of the circuit to be identified, whereas conventional BIST circuitry only determines if the quality of the IC chips is satisfactory.

On the other hand, the IC chips are designed to work properly at a default operating frequency. Furthermore, the IC chips are set at the default operating frequency plus some design margin, although the design margin is not necessary on most IC chips. In other words, if the IC chips function at a higher operating frequency than the default, the chips may improve their overall performance. However, in some extreme cases, some chips may work at a lower operating frequency than the default, as a result of quality deficiency.

Accordingly, there is a need to provide an apparatus that utilizes the BIST capability to automatically determine the optimum operating frequency for individual IC chip.

SUMMARY OF THE INVENTION

It is one object of the present invention to provide an apparatus to automatically determine the highest operating frequency for individual integrated circuit (IC) chip.

It is another object of the present invention to provide such an apparatus that utilizes the built-in self-test (BIST) capability to improve the performance and stability of individual IC chips.

The foregoing objects are achieved in an apparatus for automatically determining an operating frequency of an IC chip. The apparatus includes a BIST unit, a clock generator, and a frequency determination unit. The BIST unit is provided to test the IC chip. The clock generator provides a test clock for the IC chip. The frequency determination unit sets the clock generator to generate the test clock and determines the operating frequency in accordance with a test result produced from the BIST unit. The frequency determination unit also enables the BIST unit to test the IC chip.

Operationally, the frequency determination unit sets an initial frequency value for the clock generator providing the test clock to the IC chip. Meanwhile, the frequency determination unit enables the BIST unit to test the chip with the test condition. Then, the frequency determination unit detects the test result from the BIST unit after the built-in self-test. If the test result does not satisfy certain criteria, the frequency determination unit will tune the frequency value and set the clock generator to generate the test clock corresponding to the tuned frequency. Again, the BIST unit tests the IC chip. The apparatus repeats the tuning and testing steps until the test result has satisfied the criteria. Finally, for the IC chip, the apparatus determines the highest operating frequency that passes the built-in self-test.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 1:
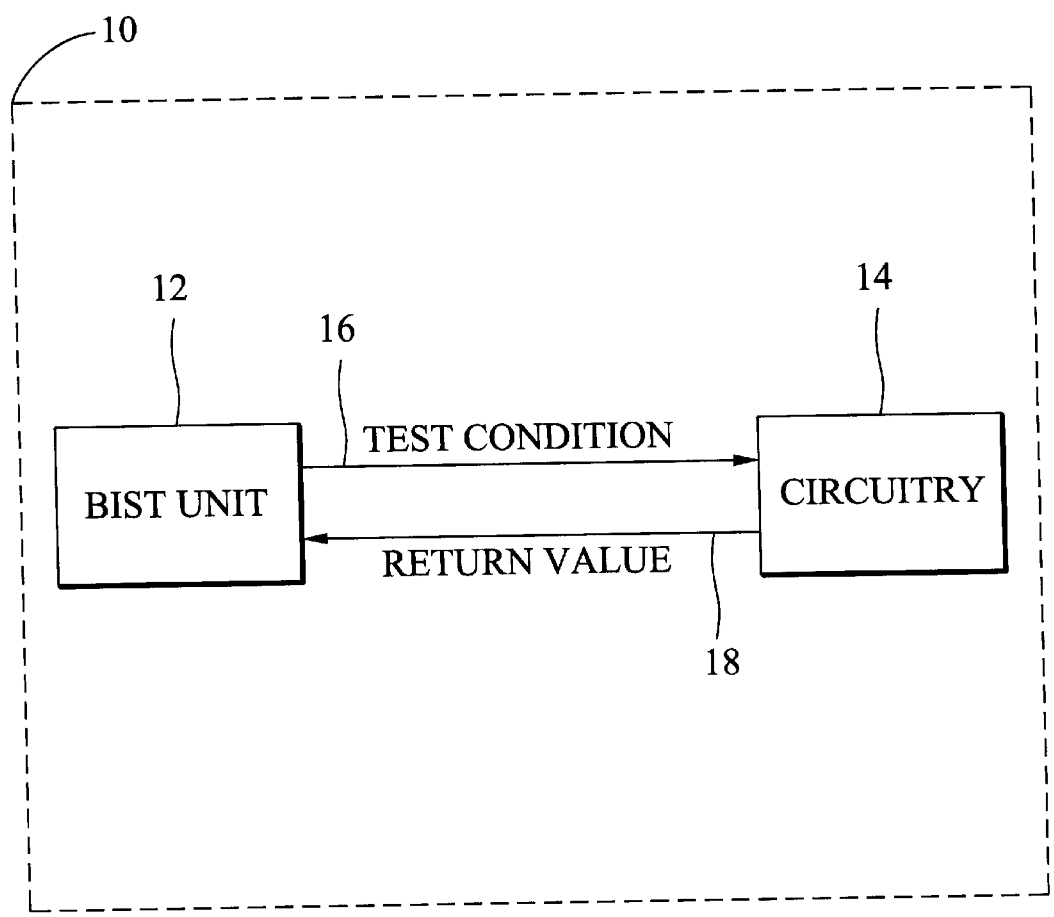
FIG. 1 is a block diagram of an integrated circuit chip in the prior art.
Figure 2:
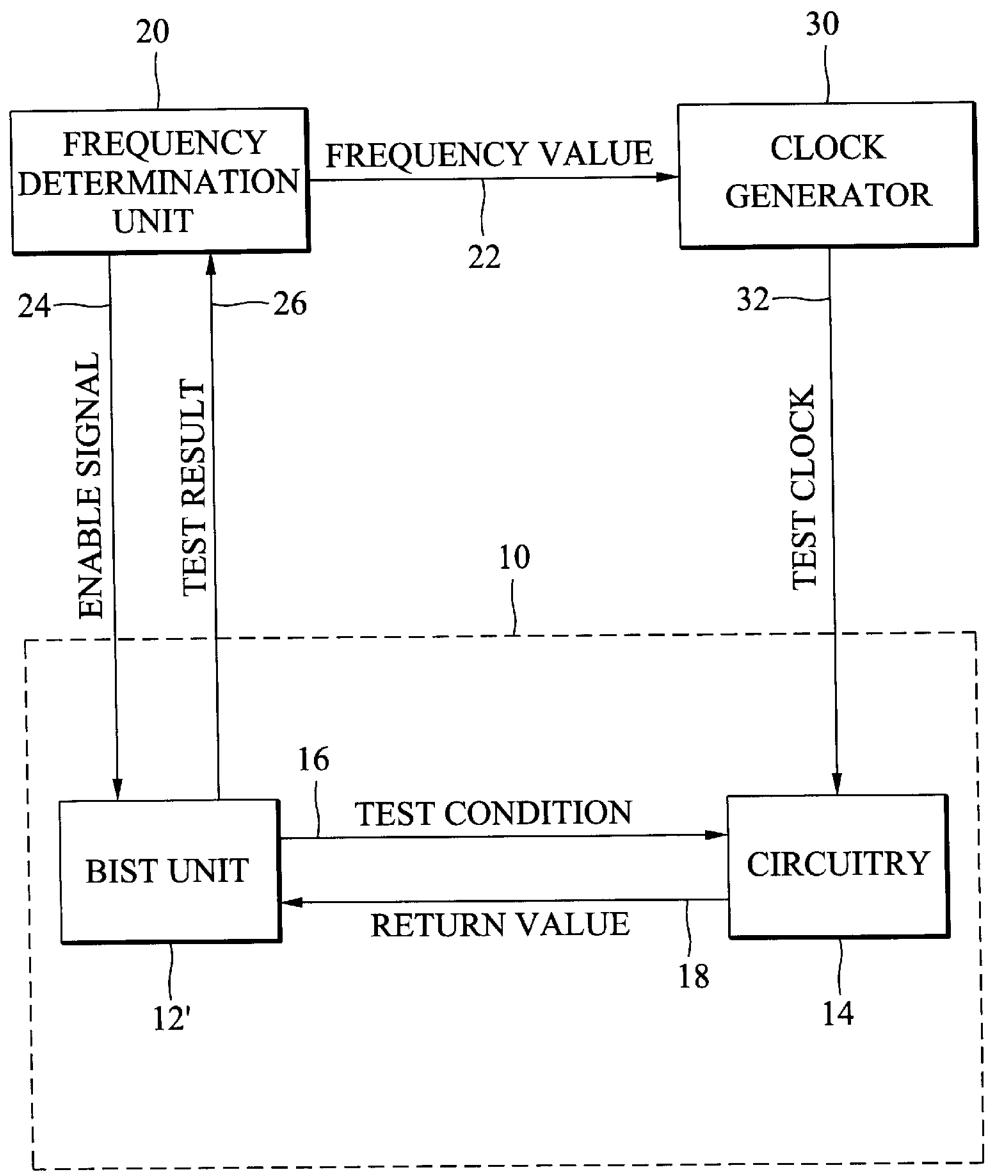
FIG. 2 is a block diagram illustrating a preferred embodiment in accordance with the present invention.

In FIG. 2, a block diagram illustrating a preferred embodiment is shown. It is understood that components shown in FIG. 2 are similar to components shown in FIG. 1, and are identified by the same reference numbers. A frequency determination unit 20 and a clock generator 30 are required to automatically determine an operating frequency of an integrated circuit (IC) chip 10. The IC chip 10 includes a built-in self-test (BIST) unit 12' and circuitry 14. The circuitry 14 may be any type of electronic system, for example, microprocessors, memory elements, or logic circuits. Alternatively, the frequency determination unit 20 and the clock generator 30, either or both, may be embedded in the IC chip 10.

The clock generator 30 provides a test clock 32 to the IC chip 10. The frequency determination unit 20 sets the clock generator 30 to generate the test clock 32 and determines the operating frequency in accordance with a test result 26 produced from the BIST unit 12'. The frequency determination unit 20 also enables the BIST unit 12', by an enable signal 24, to test the circuitry 14.

The frequency determination unit 20 sets an initial value for a frequency value 22. The frequency value 22 is applied to the clock generator 30, to provide the test clock 32 to the IC chip 10. Meanwhile, the frequency determination unit 30 enables the BIST unit 12' to test the circuitry 14 with a test condition 16. Then, the frequency determination unit 20 detects the test result 26 from the BIST unit 12' after the built-in self-test. If the test result 26 does not satisfy certain criteria, the frequency determination unit 20 will tune the frequency value 22 and set the clock generator 30 to generate the test clock 32 corresponding to the tuned frequency. Again, the BIST unit 12' tests the circuitry 14. The embodiment repeats the tuning and testing steps until the test result 26 has satisfied the criteria. Finally, for the IC chip 10, the frequency determination unit 20 determines the highest operating frequency that passes the built-in self-test.

Figure 3:
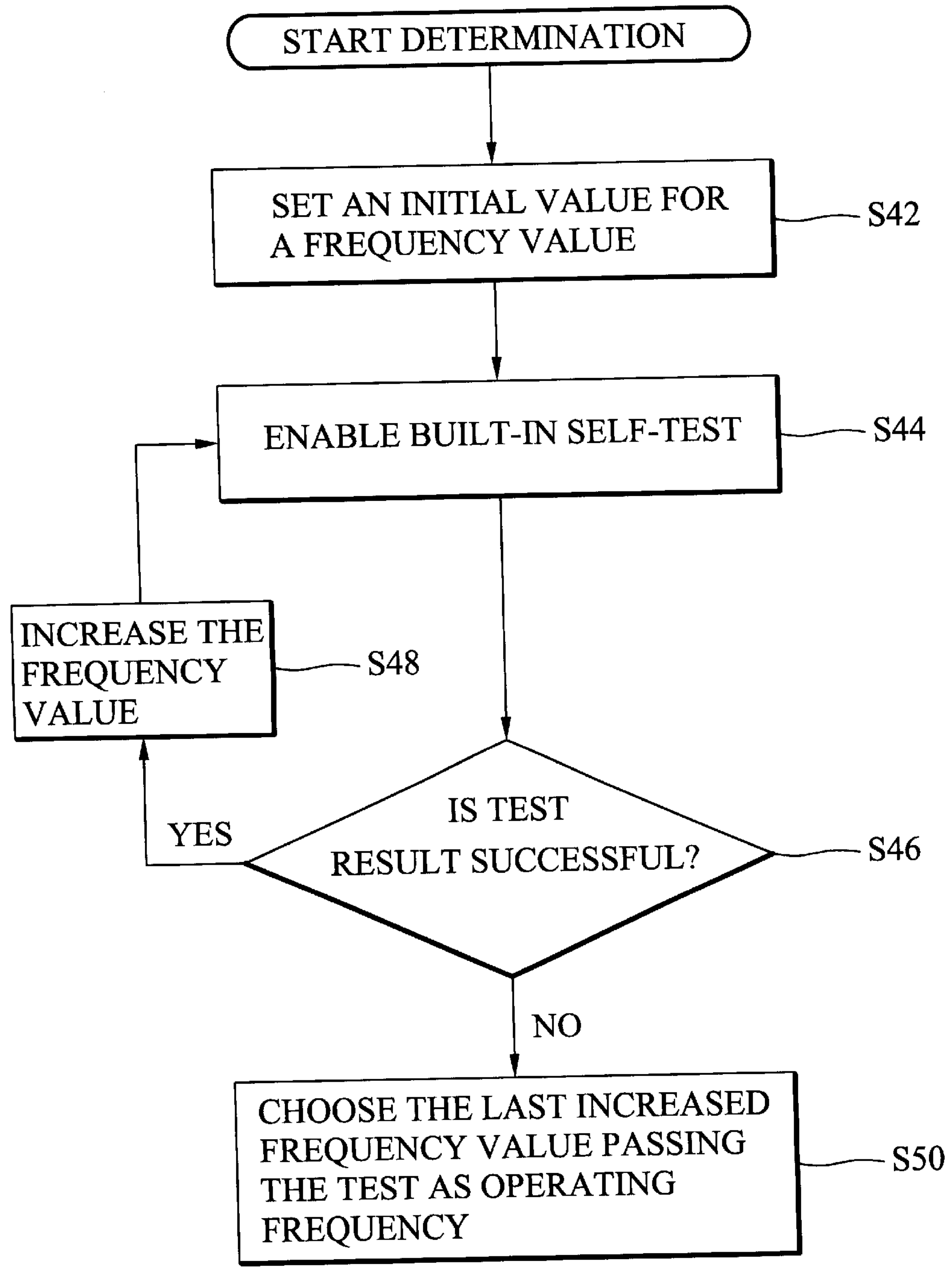
FIG. 3 is a flow chart showing the steps of frequency determination.

FIG. 3 is a flow chart showing the steps of frequency determination. The procedure shown in FIG. 3 is preferably implemented in the frequency determination unit 20. The first step is to set an initial value for a frequency value 22 (S42). The frequency value 22 is applied to the clock generator 30 to generate the test clock 32. The frequency of test clock preferably equals the frequency value 22. The frequency determination unit 20 also enables the BIST unit 12', by an enable signal 24, to test the circuitry 14 with a test condition 16 (S44). The circuitry 14 operates with the test clock 32 during the test. At the conclusion of the self-test, BIST unit 12' checks the return value 18 from the circuitry 14 and reports a test result 26 to the frequency determination unit 20. If the return value 18 indicates that the test is successful, the BIST unit 12' will provide a success value to the test result 26; otherwise, the BIST unit 12' will provide a failure value to the test result 26. The frequency determination unit 20 then examines whether the test result 26 is the success value (S46). If the test result is the success value, the frequency determination unit 20 increases the frequency value 22 and applies it to clock generator 30 (S48). The steps S44, S46, and S48 are repeated until the test result 26 becomes the failure value. The frequency determination unit 20 stops increasing the frequency value when the test fails and chooses the last increased frequency value passing the test as the operating frequency (S50). Thus, the frequency determination unit 20 has determined the highest operating frequency of the IC chip 10. Note that if the IC chip can not pass the self-test with the test clock corresponding to the initial frequency value, the IC chip will be identified as a failed chip. In other words, the initial frequency value is the lower limit of operating frequency for the IC chip.

Figure 4:
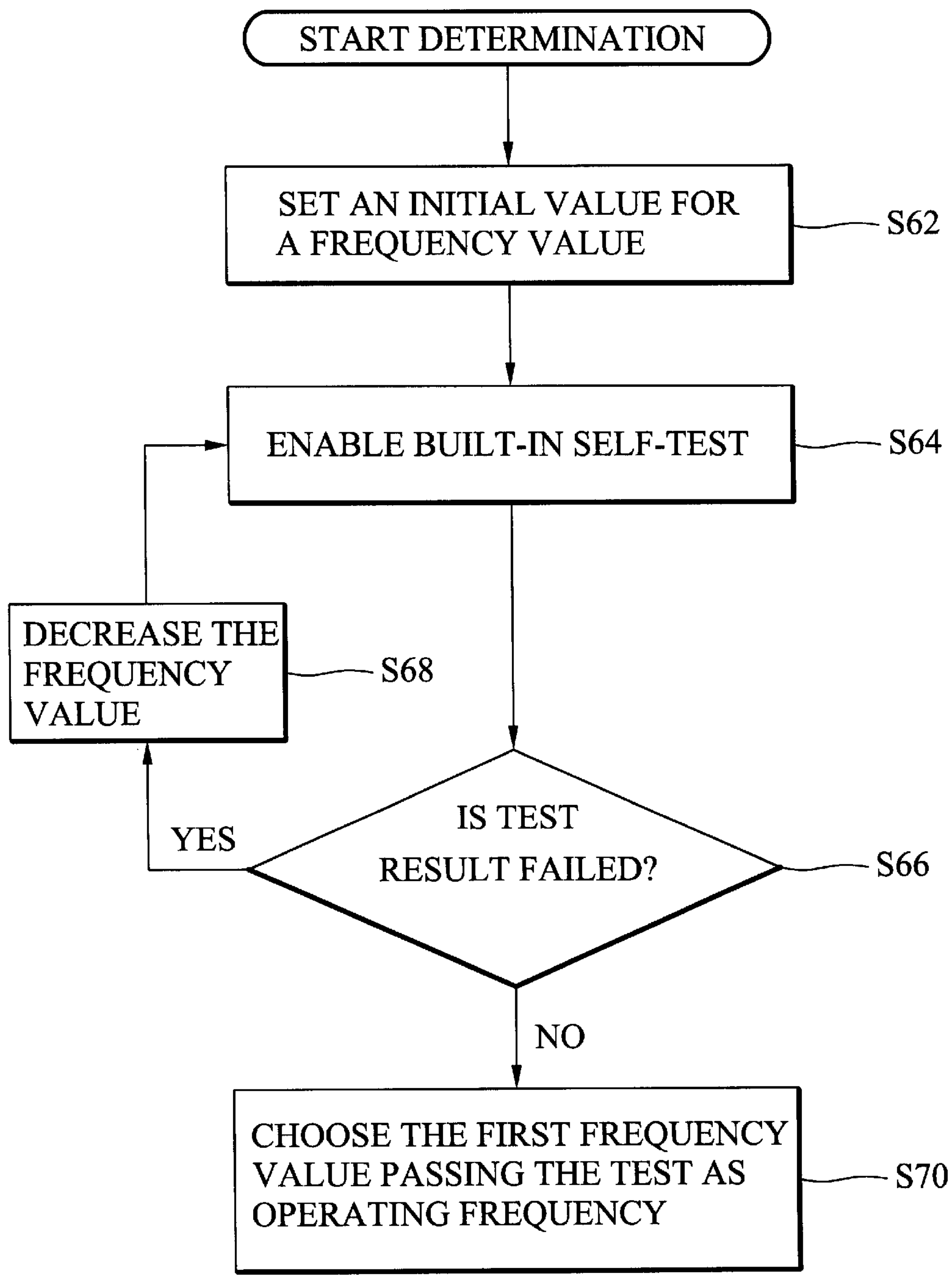
FIG. 4 is a flow chart illustrating the alternative steps of frequency determination.

Referring to FIG. 4, alternative steps of frequency determination are shown. The first step is to set an initial value for a frequency value 22 (S62). Preferably, the initial frequency value is the upper limit of operating frequency for the IC chip. The frequency value 22 is applied to the clock generator 30 for generating the test clock 32. The frequency of test clock preferably equals the frequency value 22. The frequency determination unit 20 also enables the BIST unit 12', by an enable signal 24, to test the circuitry 14 with a test condition 16 (S64). The circuitry 14 operates with the test clock 32 during the test. At the conclusion of the self-test, BIST unit 12' checks the return value 18 from the circuitry 14 and reports a test result 26 to the frequency determination unit 20. If the return value 18 indicates that the test has failed, the BIST unit 12' will provide a failure value to the test result 26; otherwise, the BIST unit 12' will provide a success value to the test result 26. The frequency determination unit 20 then examines whether the test result 26 is the failure value (S66). If the test result is the failure value, the frequency determination unit 20 decreases the frequency value 22 and applies it to the clock generator 30 (S68). The steps S64, S66, and S68 are repeated until the test result 26 achieves the success value. The frequency determination unit 20 stops decreasing the frequency value when the test succeeds and chooses the first frequency value passing the test as the operating frequency (S70). Hence, the frequency determination unit 20 has determined the highest operating frequency of the IC chip 10. It should be understood that if the IC chip can not pass the self-test with the test clock corresponding to a lower limit frequency, the IC chip will be identified as a failed chip.

Preferably, the frequency determination procedure is performed on individual IC chips at power-up. Thus, the IC chip operates with the highest operating frequency in subsequent operation.

As described in detail above, the present invention provides a novel apparatus that automatically determines the highest operating frequency for individual IC chip. Specifically, the highest operating frequency is an optimal frequency that improves the IC chip performance and stability.

The foregoing description has been directed to specific embodiments of this invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. An apparatus for determining an operating frequency of an integrated circuit chip, comprising:

a built-in self-test (BIST) unit for testing the integrated circuit chip with a test condition and producing a test result;

a clock generator for providing a test clock to the integrated circuit chip; and a frequency determination unit for setting the clock generator to generate the test clock and determining the operating frequency of the integrated circuit chip in accordance with the test result.

2. The apparatus of claim 1, wherein the BIST unit is controlled by the frequency determination unit to test the integrated circuit chip, and wherein the BIST unit is embedded in the integrated circuit chip.

3. The apparatus of claim 1, wherein the frequency determination unit tunes a frequency value based on the test result, and sets the clock generator to generate the test clock corresponding to the tuned frequency value.

4. The apparatus of claim 3, wherein the BIST unit provides a success value to the test result if the integrated circuit chip being tested works normally, wherein the frequency determination unit increases the frequency value successively if the test result is the success value.

5. The apparatus of claim 4, wherein the BIST unit tests the integrated circuit chip which operates at the test clock corresponding to the increased frequency value and produces the test result.

6. The apparatus of claim 5, wherein the frequency determination unit stops increasing the frequency value when the test fails and chooses the last increased frequency value passing the test as the operating frequency.

7. The apparatus of claim 3, wherein the BIST unit provides a failure value to the test result if the integrated circuit chip being tested works abnormally, wherein the frequency determination unit decreases the frequency value successively if the test result is the failure value.

8. The apparatus of claim 7, wherein the BIST unit tests the integrated circuit chip which operates at the test clock corresponding to the decreased frequency value and produces the test result.

9. The apparatus of claim 8, wherein the frequency determination unit stops decreasing the frequency value when the test succeeds and chooses the first frequency value passing the test as the operating frequency.

10. A method of determining an operating frequency of an integrated circuit chip, comprising:

providing a test clock;

testing the integrated circuit chip that works at the test clock and producing a test result; and determining the operating frequency in accordance with the test result.

11. The method of claim 10, wherein the testing step comprises:

increasing a frequency value of the test clock;

testing the integrated circuit chip working at the test clock with the increased frequency value and producing the test result; and repeating the increasing and testing steps until the test result fails.

12. The method of claim 11, wherein the determining step is choosing the last increased frequency value passing the test as the operating frequency.

13. The method of claim 10, wherein the testing step comprises:

decreasing a frequency value of the test clock;

testing the integrated circuit chip working at the test clock with the decreased frequency value and producing a test result; and repeating the decreasing and testing steps until the test result is successful.

14. The method of claim 13, wherein the determining step is choosing the first frequency value passing the test as the operating frequency.

15. The method of claim 10, wherein the testing step is a built-in self test.

16. An integrated circuit chip comprising:

a circuit;

a built-in self-test (BIST) unit coupled to the circuit, the BIST unit testing the circuit with a test condition and producing a test result;

a clock generator for providing a test clock to the circuit; and a frequency determination unit for setting the clock generator to generate the test clock and determining an operating frequency in accordance with the test result, wherein the BIST unit is controlled by the frequency determination unit to test the circuit.

17. The integrated circuit chip of claim 16, wherein the frequency determination unit tunes a frequency value based on the test result, and sets the clock generator to generate the test clock corresponding to the tuned frequency value.

18. The integrated circuit chip of claim 17, wherein the BIST unit provides a success value to the test value if the circuit being tested works normally, wherein the frequency determination unit increases the frequency value successively if the test result is the success value.

19. The integrated circuit chip of claim 18, wherein the BIST unit tests the circuit that operates at the test clock corresponding to the increased frequency value and produces the test result.

20. The integrated circuit chip of claim 19, wherein the frequency determination unit stops increasing the frequency value when the test fails and chooses the last increased frequency value passing the test as the operating frequency.

* * * * *